(12) United States Patent
Ohkubo et al.

(10) Patent No.: US 6,849,913 B2
(45) Date of Patent: Feb. 1, 2005

(54) INTEGRATED CIRCUIT INCLUDING AN INDUCTOR, ACTIVE LAYERS WITH ISOLATION DIELECTRICS, AND MULTIPLE INSULATION LAYERS

(75) Inventors: Hiroaki Ohkubo, Tokyo (JP); Yasutaka Nakashiba, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 10/273,313

(22) Filed: Oct. 17, 2002

(65) Prior Publication Data

US 2003/0075776 A1 Apr. 24, 2003

(30) Foreign Application Priority Data

Oct. 19, 2001 (JP) ........................................ 2001-322299

(51) Int. Cl.⁷ .......................... H01L 27/14; H01L 31/00; H01L 29/00
(52) U.S. Cl. ......................... 257/428; 257/501; 257/531
(58) Field of Search ............................... 257/257, 501, 257/531, 428

(56) References Cited

U.S. PATENT DOCUMENTS 6,452,259 B2 * 9/2002 Akiyama .................... 257/686

2002/0110989 A1 * 8/2002 Yamaguchi et al. ........ 438/311

FOREIGN PATENT DOCUMENTS

| JP | 10-321802 | 12/1998 |
|----|-----------|---------|
| JP | 11-274412 | 10/1999 |

* cited by examiner

Primary Examiner—William M. Brewster
(74) Attorney, Agent, or Firm—Katten Muchin Zavis Rosenman

(57) ABSTRACT

A semiconductor substrate made of P⁻ type or P⁻⁻ type silicon having a thickness of approximately 700 $\mu$m and a resistivity of 10 $\Omega$·cm to 1000 $\Omega$·cm is provided, a BOX layer with a thickness of 0.2 $\mu$m to 10 $\mu$m is provided on the semiconductor substrate and a p⁻ type SOI layer is provided on this BOX layer. A first insulating film, which makes contact with the BOX layer, is locally buried in this p⁻ type SOI layer and a CMOS is formed in a region of the p⁻ type SOI layer wherein the above-described first insulating film is not provided. A second insulating film is provided above the first insulating film and over the CMOS, so as to cover the CMOS, and an inductor is provided on the region of this second insulating film corresponding to the first insulating film.

10 Claims, 9 Drawing Sheets

INTEGRATED CIRCUIT INCLUDING AN INDUCTOR, ACTIVE LAYERS WITH ISOLATION DIELECTRICS, AND MULTIPLE INSULATION LAYERS

BACKGROUND OF THE INVENTION

1. Field of the Invention

The present invention relates to an integrated circuit provided with an active element, such as a CMOS (complementary metal oxide semiconductor), a TFT (thin film transistor), or the like, and provided with an inductor as well as to a manufacturing method for the same, in particular, relates to an integrated circuit wherein an increase in speed of an active element is achieved and wherein an improvement in the characteristics of an inductor is achieved as well as to a manufacturing method thereof.

2. Description of the Related Art

An integrated circuit provided with an active element, such as a CMOS, a TFT, or the like, wherein an inductor has conventionally been fabricated on a standard substrate and an epitaxial layer including P type impurities is formed on a $P^+$ bulk substrate.

FIG. 1 is a cross sectional view showing a conventional integrated circuit. A standard substrate wherein a $P^-$ epitaxial layer 52 is formed on a $P^+$ bulk substrate 51 is utilized for the substrate of this integrated circuit according to the prior art. The $P^+$ bulk substrate 51 has a resistivity of approximately $0.01 \Omega \cdot$ cm and a thickness of approximately 700 .m while the $P^-$ epitaxial layer 52 has a resistivity of approximately $10 \Omega \cdot$ cm and a thickness of approximately 5 $\mu$m. A CMOS 55, which is an active element, is provided in a portion of a region in the surface of the $P^-$ epitaxial layer 52 and the CMOS 55 includes a P well 53 and an N well 54. An insulating film 56 is provided in a region of the $P^-$ epitaxial layer 52 wherein the CMOS 55 is not provided and an insulating film 57 is provided on the CMOS 55 and the insulating film 56. An inductor 58 is provided on the portion of the region of the insulating film 57 corresponding to the insulating film 56. In the integrated circuit shown in FIG. 1, latch-up is suppressed in the CMOS 55 and gathering of impurities in the CMOS 55 can be promoted by utilizing the standard substrate made of the $P^+$ bulk substrate 51 and the $P^-$ epitaxial layer 52.

In this conventional integrated circuit shown in FIG. 1, however, the resistivity of the $P^+$ bulk substrate 51 has a low value of approximately $0.01 \Omega \cdot$cm and, therefore, an eddy current flows within the $P^+$ bulk substrate 51 so that a problem arises wherein an eddy current loss occurs at the time of operation of the inductor 58. As a result, the Q value of the inductor 58 is lowered so that the characteristics of the inductor 58 deteriorate. In addition, a parasitic capacitance occurs between the inductor 58 and the $P^+$ bulk substrate 51 so that the characteristics of the inductor 58 deteriorate. Furthermore, a parasitic capacitance also occurs between the CMOS 55 and the $P^+$ bulk substrate 51 so that a problem arises wherein increase in the speed of the CMOS 55 cannot be achieved.

A technique wherein a trench is created in the surface layer of a substrate under an inductor and an insulating material is filled into this trench is disclosed in Japanese Patent Application Laid-open No. 321802/1998. Thereby, the path of an eddy current can be shortened so that the occurrence of an eddy current can be suppressed, according to the description therein.

In addition, a technique similar to that of Japanese Patent Application Laid-open No. 321802/1998 wherein a trench is created in the surface layer of a substrate under an inductor and an insulating material is filled into this trench is disclosed in Japanese Patent Application Laid-open No. 274412/1999. Thereby, the effective surface area of the substrate can be reduced so that the parasitic capacitance is reduced according to the description therein.

The above-described conventional technologies, however, have problems as shown below. It is extremely difficult to create a deep trench according to the technologies disclosed in Japanese Patent Application Laid-open No. 321802/1998 and in Japanese Patent Application Laid-open No. 274412/1999. Therefore, a sufficiently deep trench cannot be created according to these technologies and an insulating film having a thickness sufficient to significantly improve the characteristics of an inductor cannot be created. Accordingly, the effects obtained according to the technique disclosed in Japanese Patent Application Laid-open No. 321802/1998 are not sufficient to improve the characteristics of an inductor. In addition, an increase in speed of an active element cannot be achieved according to this technique. In addition, an insulating film having a sufficient thickness cannot be created according to the technique disclosed in Japanese Patent Application Laid-open No. 274412/1999 and, therefore, effects are insufficient to improve the characteristics of an inductor. In addition, an increase in speed of an active element cannot be achieved according to this technique. Accordingly, the characteristics of an active element and an inductor cannot be significantly improved even in the case wherein the technologies disclosed in Japanese Patent Application Laid-open No. 321802/1998 and Japanese Patent Application Laid-open No. 274412/1999 are applied.

SUMMARY OF THE INVENTION

An object of the present invention is to provide an integrated circuit having an active element, such as a CMOS, and having an inductor wherein an increase in speed of the active element is achieved while the latch-up characteristics of the active element are maintained and, at the same time, wherein improvement in the characteristics of the inductor is achieved as well as to provide a manufacturing method for the same.

An integrated circuit according to the present invention comprises: a semiconductor substrate; a first insulating film provided on the semiconductor substrate; a second insulating film locally formed on the first insulating film; a semiconductor layer formed in a region of the first insulating film, in which the second insulating film is not formed; an isolation dielectrics formed on the surface of the semiconductor layer; an active element formed in an active element formation region partitioned off by means of the isolation dielectrics; a third insulating film formed on the second insulating film and on the semiconductor layer; and an inductor formed on a portion of the third insulating film located above the second insulating film.

According to the present invention, the first insulating film is provided between the active element and the semiconductor substrate and, thereby, parasitic capacitance between the active element and the semiconductor substrate can be reduced so that the speed of operation of the active element can be increased. In addition, latch-up of the active element can be prevented. Furthermore, a continuous insulator layer is formed of the first to third insulating films between the inductor and the semiconductor substrate and, thereby, an eddy current within the semiconductor substrate can be suppressed and, at the same time, parasitic capacitance between the inductor and the substrate can be reduced. As a result of this, the Q value of the inductor can be increased and the characteristics of the inductor can be improved.

Another aspect of an integrated circuit according to the present invention comprises: a semiconductor substrate; a first insulating film provided on the semiconductor substrate; a second insulating film locally formed on the first insulating film; a fourth insulating film formed on the second insulating film; a semiconductor layer formed in a region of the first insulating film wherein neither the second insulating film, nor the fourth insulating film, is formed; an isolation dielectrics formed on the surface of the semiconductor layer; an active element formed in an active element formation region partitioned off by means of the isolation dielectrics; a third insulating film formed on the fourth insulating film and on the semiconductor layer; and an inductor formed on a portion of the third insulating film located above the fourth insulating film.

In addition, it is preferable for the semiconductor substrate to have a resistivity greater than that of the semiconductor layer and it is preferable for the resistivity of the semiconductor substrate to be not less than 10 Ω·cm. Thereby, the eddy current within the semiconductor substrate can be further suppressed.

Furthermore, the second insulating film may be formed in a grid form, as viewed from the direction perpendicular to the surface of the semiconductor substrate, or the second insulating film may be formed of a plurality of portions in thin rectangular strip-forms so that these portions in thin rectangular strip-forms are arranged in a radial form or are arranged so as to be parallel to each other, as viewed from the direction perpendicular to the surface of the semiconductor substrate. Thereby, formation of the second insulating film becomes simple.

In accordance with a manufacturing method for an integrated circuit according to the present invention, a first insulating film is formed on a semiconductor substrate; a semiconductor layer is formed on the first insulating film; a trench reaching to the first insulating film is created in the semiconductor layer; a second insulating film in the same layer as the semiconductor layer is formed by filling in an insulating material into the above trench; an isolation dielectrics is formed in the surface of the semiconductor layer wherein the second insulating film is not formed; an active element is formed in an active element formation region partitioned off by the above isolation dielectrics; a third insulating film is formed on the semiconductor layer and on the second insulating film; and an inductor is formed on a portion of the third insulating film above the second insulating film.

In accordance with another aspect of a manufacturing method for an integrated circuit according to the present invention, a first insulating film is formed on a semiconductor substrate; a semiconductor layer is formed on the first insulating film; a first trench is locally created in the surface of the semiconductor layer; a second trench reaching to the first insulating film is created in the surface of the semiconductor layer; an isolation dielectrics is formed by filling in an insulating material into the first trench; a second insulating film is formed by filling in an insulating material into the second trench; an active element is formed in an active element formation region partitioned off by the isolation dielectrics; a third insulating film is formed on the semiconductor layer and on the second insulating film; and an inductor is formed on a portion of the third insulating film above the second insulating film.

In accordance with still another aspect of a manufacturing method for an integrated circuit according to the present invention, a first insulating film is formed on a semiconductor substrate; a semiconductor layer is formed on the first insulating film; a first trench and a second trench are created in the surface of the semiconductor layer; a third trench reaching to the first insulating film is locally created within the second trench; an isolation dielectrics is formed within the first trench and, at the same time, two layers of insulating film are formed of the fourth and second insulating films within the second and third trenches, by filling in an insulating material into the first to third trenches; an active element is formed in an active element formation region partitioned off by the isolation dielectrics, a third insulating film is formed on the semiconductor layer and on the fourth insulating film; and an inductor is formed on a portion of the third insulating film above the fourth insulating film.

In accordance with the above detailed description, an integrated circuit provided with an active element, such as a CMOS, and an inductor, wherein an increase in the speed of the active element is achieved while the latch-up characteristics of the active element are maintained and wherein an improvement in the characteristics of the inductor is achieved can be obtained according to the present invention.

DETAILED DESCRIPTION OF THE PREFERRED EMBODIMENTS

The present inventors have acquired the knowledge shown below as a result of intensive experimentation and research aimed at solving the above-described problems. That is to say, according to the technique disclosed in Japanese Patent Application Laid-open No. 321802/1998, a trench is created in the surface layer of the substrate and an insulating material filled into the trench wherein it is difficult to make the trench deep and, therefore, the thickness of the formed insulating film is insufficient. In addition, an eddy current occurs in the portion of the substrate between trenches. Therefore, the effects that are obtained provide insufficient improvement in the characteristics of an inductor.

In addition, according to the technique disclosed in Japanese Patent Application Laid-open No. 274412/1999, though the effective surface area of the substrate is reduced, it is also difficult to create a deep trench according to this technique and, therefore, the thickness of the formed insulating layer is insufficient. Therefore, reduction in parasitic capacitance is not sufficient and, accordingly, the effects that are obtained provide insufficient improvement in the characteristics of an inductor.

Therefore, according to the present invention, a technique has been developed to improve the characteristics of an inductor, while maintaining the latch-up characteristics of an active element and achieving an increase in the speed of the active element, wherein an insulating film is formed on the semiconductor substrate, a semiconductor layer for forming an active element is formed on this insulating film, a trench reaching to the above-described insulating film is created in this semiconductor layer so that an insulating material is filled into this trench and, thereby, the above-described insulating film and the insulating film formed on the above-described active element are connected to each other so that a continuous insulator layer is provided between the inductor and the semiconductor substrate, whereby the present invention is completed.

Figure 2:
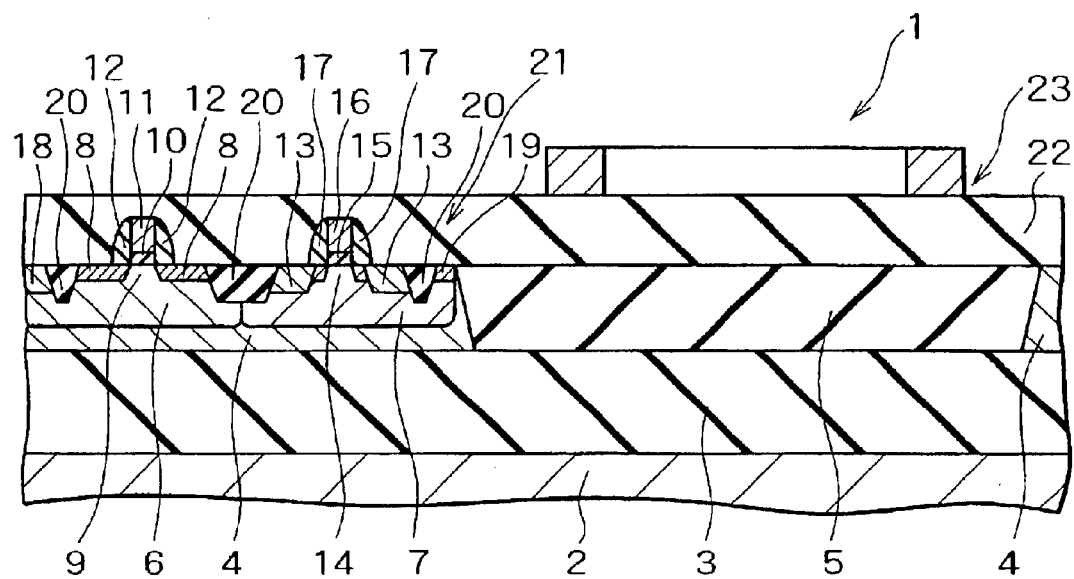
FIG. 2 is a cross sectional view showing an integrated circuit according to the first embodiment of the present invention.
Figure 3:
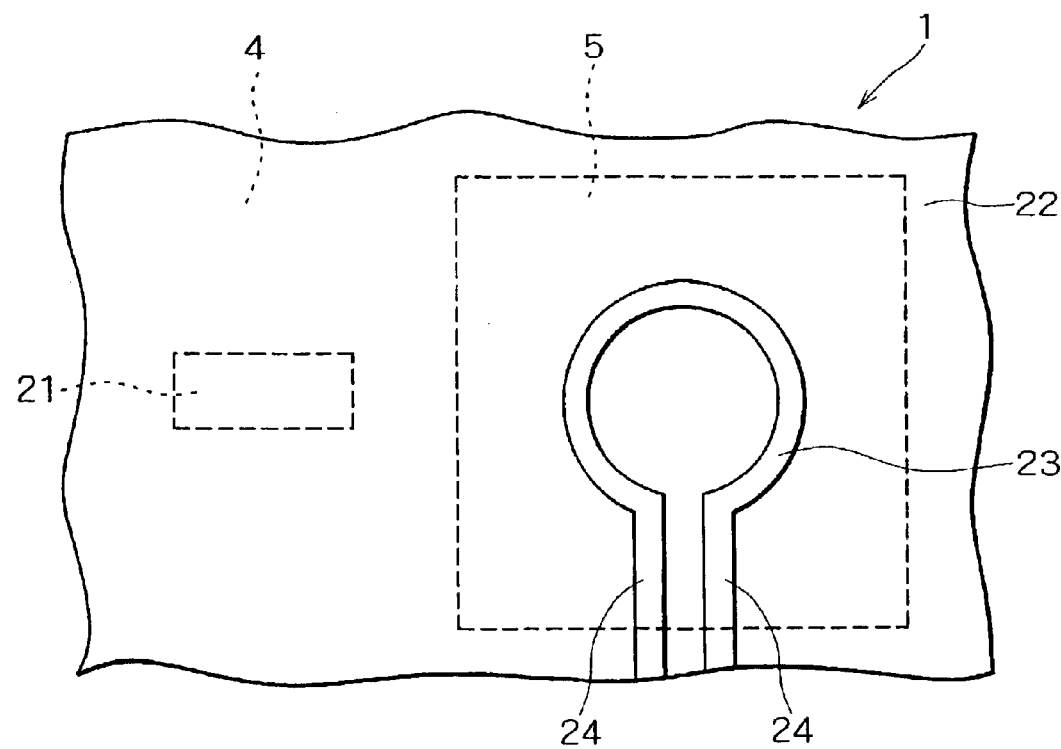
FIG. 3 is a plan view showing the integrated circuit of the present embodiment.

In the following, the embodiments of the present invention are concretely described in reference to the attached drawings. First, a first embodiment of the present invention is described. FIG. 2 is a cross sectional view showing an integrated circuit according to the first embodiment of the present invention and FIG. 3 is plan view showing this integrated circuit.

As shown in FIG. 2, a semiconductor substrate 2 made of P⁻ type or P⁻ type silicon is provided in an integrated circuit 1 according to the present embodiment. The thickness of the semiconductor substrate 2 is, for example, approximately 700 $\mu$m and the resistivity thereof is, for example, 10Ω·cm to 1000Ω·cm. An insulating BOX layer 3, which is a buried oxide film, is provided on the semiconductor substrate 2. The thickness of the BOX layer 3 is, for example, 0.2 $\mu$m to 10 $\mu$m. A p⁻ type SOI layer 4 is provided on the BOX layer 3. The thickness of the p⁻ type SOI layer 4 is, for example, approximately 0.2 $\mu$m and the resistivity thereof is lower than the resistivity of the semiconductor substrate 2 being, for example, approximately 10Ω·cm. An insulating film 5 is locally buried in a portion of the p⁻ type SOI layer 4. The insulating film 5 is in the same layer as the p⁻ type SOI layer 4 and makes contact with BOX layer 3. That is to say, the p⁻ type SOI layer 4 does not exist in the region wherein the insulating film 5 is formed. The insulating film 5 is, for example, a silicon oxide film.

A P well 6 is provided in the surface of the p⁻ type SOI layer 4 and an N well 7 is provided adjacent to this P well 6. n⁺ type source and drain regions 8, making up a pair, are provided facing each other in the surface of the P well 6 and a region between n⁺ type source and drain regions 8 is a channel region 9. A gate insulating film 10 is provided on the channel region 9 and a gate electrode 11 is provided on the gate insulating film 10. A pair of sidewalls 12, which sandwich the gate insulating film 10 and the gate electrode 11, is provided in regions adjacent to gate insulating film 10 and gate electrode 11, respectively, above the n⁺ type source and drain regions 8.

p⁺ type source and drain regions 13, making up a pair, are provided facing each other in the surface of the N well 7 in the same manner as above and a region between the p⁺ type source and drain regions 13 is a channel region 14. A gate insulating film 15 is provided on the channel region 14 and a gate electrode 16 is provided on the gate insulating film 15. A pair of sidewalls 17, which sandwich the gate insulating film 15 and the gate electrode 16, is provided in regions adjacent to the gate insulating film 15 and the gate electrode 16, respectively, above the p⁺ type source and drain regions 13. In addition, an electrode 18, made of a p⁺ region, is provided in an area on the side of the P well 6, which is not adjacent to the N well 7, while an electrode 19, made of a n⁺ region, is provided in an area on the side of N well 7, which is not adjacent to P well 6. Furthermore, isolation dielectrics 20 are provided between the electrode 18 and the n⁺ type source or drain region 8, between the n⁺ type source or drain region 8 and the p⁺ type source or drain region 13, and between the p⁺ type source or drain region 13 and the electrode 19, respectively. The bottom surfaces of the isolation dielectrics 20 do not make contact with the top surface of the BOX layer 3. A CMOS 21 is formed of the P well 6, N well 7, a pair of n⁺ type source and drain regions 8, a pair of p⁺ type source and drain regions 13, channel regions 9 and 14, gate insulating films 10 and 15, gate electrodes 11 and 16, sidewalls 12 and 17 as well as electrodes 18 and 19, respectively, making up pairs, isolation dielectrics 20 and p⁻ type SOI layer 4 in the vicinity of P well 6 and N well 7.

An insulating film 22 is provided above the insulating film 5 and over the CMOS 21, so as to cover the CMOS 21. The bottom surface of the insulating film 22 makes contact with the top surface of the insulating film 5. The thickness of the insulating film 22 is, for example, approximately 5 $\mu$m and four layers of wires (not shown) are, for example, buried in the insulating film 22. In addition, an inductor 23 is formed in a region on the insulating film 22, located away from a region above the CMOS 21, that is to say, in a region corresponding to the insulating film 5. The inductor 23 is, for example, made of aluminum, of which the thickness is, for example, approximately 2 $\mu$m.

As shown in FIG. 3, the inductor 23 is a wire having one winding in a circular loop-form, of which the inner diameter is, for example, 50 $\mu$m and the wire width is, for example, 10 $\mu$m. Terminal portions 24, making up a pair, are connected to the respective ends of the inductor 23. In addition, as shown in FIG. 3, the insulating film 22 is provided under the inductor 23 and the terminal portions 24, and the insulating film 5 is provided in a region under the insulating film 22 located under the inductor 23. The outer periphery of the insulating film 5 is placed outside of the outer periphery of the inductor 23, as seen in the plan view. In addition, the CMOS 21 is formed, in a portion of a region located away from a region directly under inductor 23, under insulating film 22, and located.

Figure 1:
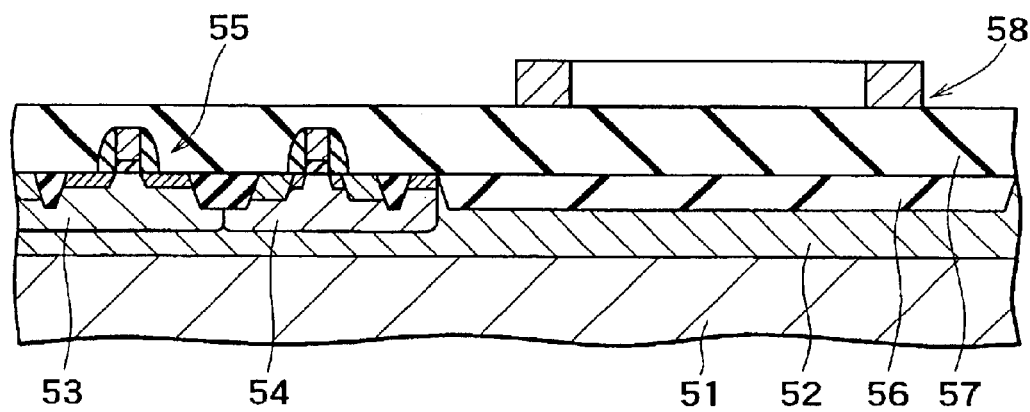
FIG. 1 is a cross sectional view showing a conventional integrated circuit.

The insulating BOX layer 3 is provided directly under the CMOS 21 in the integrated circuit 1 of the present embodiment and, therefore, the parasitic capacitance between the CMOS 21 and the semiconductor substrate 2 has a low value so that the speed of operation of the CMOS 21 can be increased. In addition, the latch-up characteristics of the CMOS 21 are excellent. Furthermore, the BOX layer 3 is provided on the semiconductor substrate 2 in the present embodiment and, therefore, the semiconductor substrate 2 can be arbitrarily selected without the need for taking into consideration effects on the CMOS 21. Therefore, the resistivity of the semiconductor substrate 2 can be enhanced to a value ranging from 10 Ω·cm to 1000 Ω·cm and an eddy current can be prevented from flowing within the semiconductor substrate 2 at the time of operation of the inductor 23. Furthermore, a continuous insulator layer is formed of the BOX layer 3, the insulating films 5 and 22 between the inductor 23 and the semiconductor substrate 2 and, therefore, an eddy current can, further, be prevented from flowing within the semiconductor substrate 2 and, at the same time, parasitic capacitance between the inductor 23 and the semiconductor substrate 2 can be reduced. As a result of this, the Q value of the inductor 23 can be increased and the characteristics of the inductor 23 can be improved. As a result of evaluation of inductor 23 in the integrated circuit 1 of the present embodiment according to a simulation, the Q value of the inductor 23 is approximately 4.8. In contrast to this, as a result of evaluation of the Q value of the inductor 58 in the conventional integrated circuit, shown in FIG. 1, a value of approximately 3.0 is obtained according to a similar simulation.

Still, though in the present embodiment an example is shown wherein the inductor 23 is in a circular form, the form of the inductor may be polygonal, such as a quadrangle, an octagon, or the like, in addition to the circular form. In addition, though in the present embodiment an example is shown wherein the number of windings of the inductor 23 is one, the number of windings may be plural. The material, size, form and number of windings of the inductor 23 can be appropriately selected according to the characteristics required for the inductor 23. Furthermore, though in the present embodiment an example is shown wherein a p type silicon substrate is utilized as a semiconductor substrate, the semiconductor substrate is not limited to this but, rather, may be an n type silicon substrate or may be a substrate made of another semiconductor material. Moreover, though in the present embodiment an example is shown wherein the outer periphery of the insulating film 5 is positioned outside of the outer periphery of the inductor 23, as seen in the plan view, a certain effect can be obtained in the case that the insulating film 5 exists in at least a portion of a region below the inductor 23.

Figure 4A:
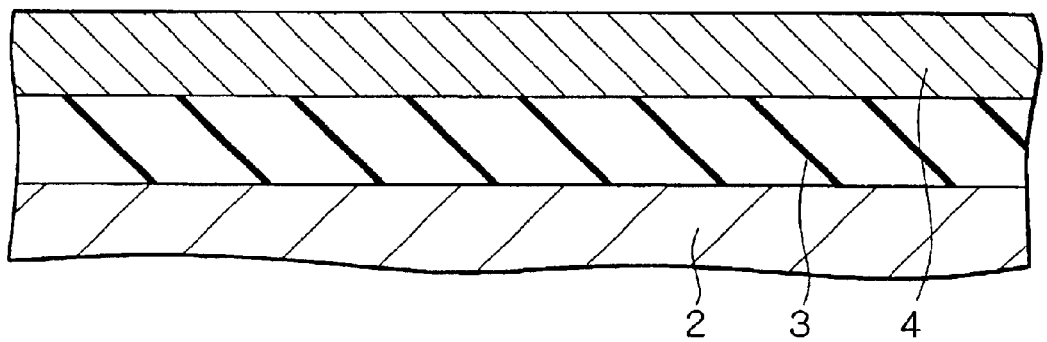
FIGS. 4A through 4C are cross sectional views showing a manufacturing method for an integrated circuit according to the present embodiment in accordance with the order of the steps thereof.
Figure 4B:
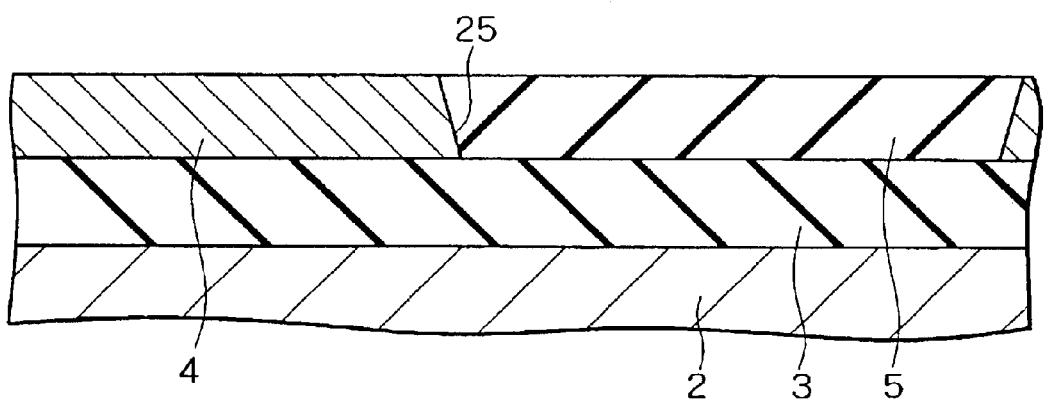
Figure 4C:
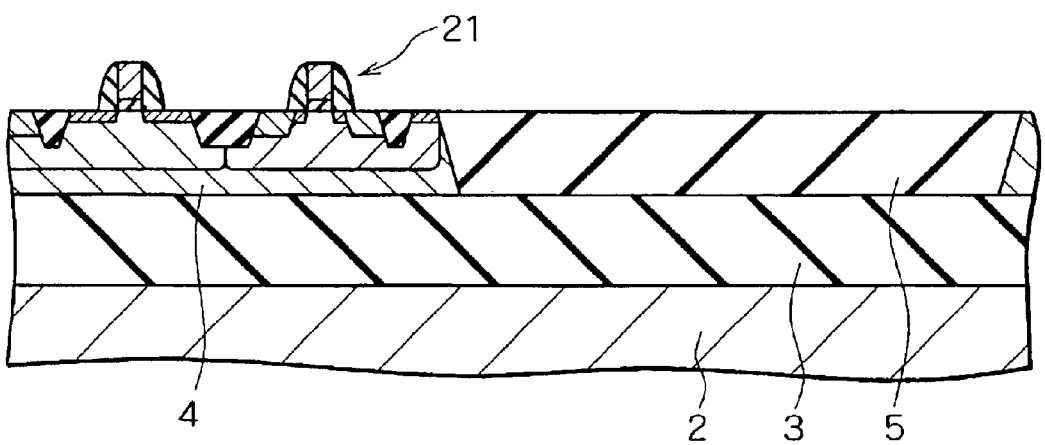

Next, a manufacturing method for the integrated circuit 1 according to the present embodiment is described. FIGS. 4A through 4C are cross sectional views showing a manufacturing method for an integrated circuit according to the present embodiment, in the order of steps thereof. First, as shown in FIG. 4A, a semiconductor substrate 2 made of p⁻ type or p⁻⁻ type silicon having a thickness of, for example, approximately 700 μm is prepared. The resistivity of semiconductor substrate 2 is, for example, in a range of from approximately 10 Ω·cm to 1000 Ω·cm. Next, A BOX layer 3, which is a buried insulating oxide film, is formed on the semiconductor substrate 2. The thickness of the BOX layer 3 is, for example, in the range of 0.2 μm to 10 μm. Next, a p⁻ type SOI layer 4 is formed on BOX layer 3.

Next, as shown in FIG. 4B, a deep trench 25 reaching to the BOX layer 3 is created in a portion of the p⁻ type SOI layer 4 and an insulating material is filled into the deep trench 25 so that an insulating film 5 is locally formed. The insulating film 5 is formed in an inductor formation region wherein an inductor 23 is formed, in a subsequent process.

Next, as shown in FIG. 4C, a CMOS 21 is formed, according to a conventional method, in the surface of the p⁻ type SOI layer 4. The configuration of the CMOS 21 is as described above.

Next, as shown in FIG. 2, an insulating film 22 is formed over the CMOS 21 and the insulating film 5. Four layers of wires (not shown) are, for example, formed in the insulating film 22 wherein the insulating material is filled in between the wires. The thickness of insulating film 22 is, for example, approximately 5 μm. Next, a wire having one winding in a circular loop-form (see FIG. 3) is formed of aluminum in a region on the insulating film 22 located above the insulating film 5, so as to fabricate an inductor 23. In addition, terminal portions 24, making up a pair, are formed on the respective ends of the inductor 23 so as to make connections with the inductor 23. The terminal portions 24 are connected to the wires (not shown) of the insulating film 22. Thereby, the integrated circuit 1 according to the present embodiment is fabricated.

Figure 5:
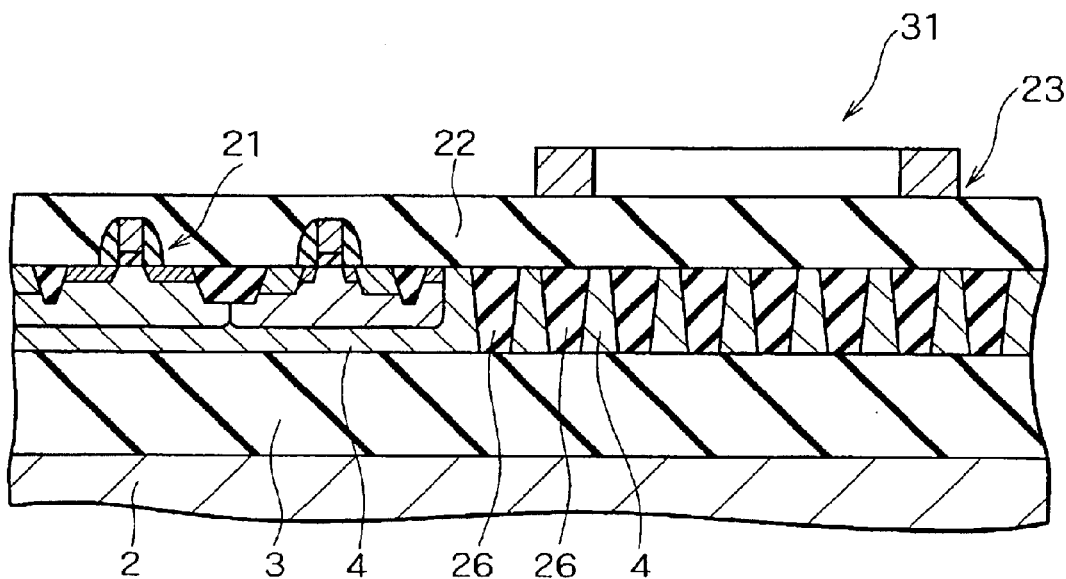
FIG. 5 is a cross sectional view showing an integrated circuit according to the second embodiment of the present invention.
Figure 6:
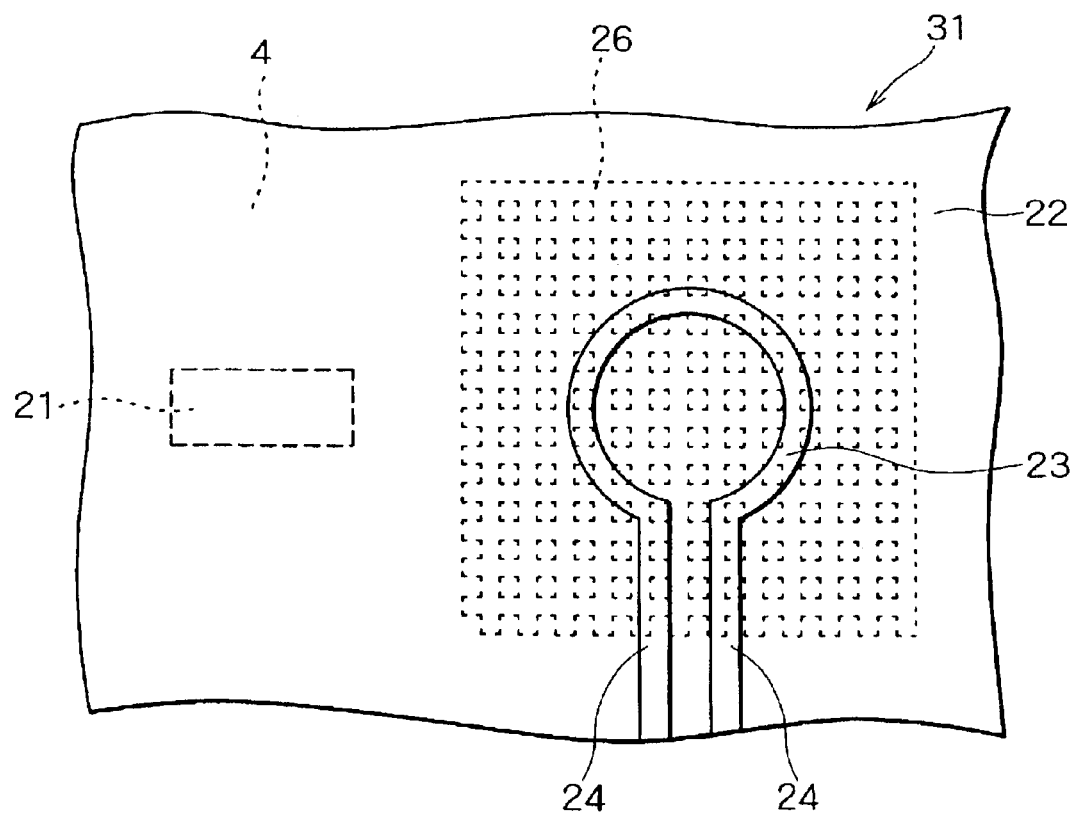
FIG. 6 is a plan view showing the integrated circuit of the present embodiment.

Next, a second embodiment of the present invention is described. FIG. 5 is a cross sectional view showing an integrated circuit according to the second embodiment of the present invention and FIG. 6 is a plan view showing this integrated circuit. The same symbols are attached to the same components, from among the components of the integrated circuit according to the present embodiment, as of integrated circuit 1 according to the above-described first embodiment and detailed descriptions thereof are omitted.

As shown in FIG. 5, an integrated circuit 31 according to the present embodiment has a configuration wherein the insulating film 5 in integrated circuit 1 (see FIG. 2) according to the first embodiment is replaced by an insulating film 26. The parts of the configuration other than the above in the integrated circuit 31 are the same as in the configuration of the integrated circuit 1 according to the first embodiment. That is to say, a semiconductor substrate 2 made of P⁻ type or P⁻⁻ type silicon is provided in the integrated circuit 31. A BOX layer 3, which is a buried oxide film, is provided on the semiconductor substrate 2. The thickness of the BOX layer 3 is, for example, in a range of 0.2 μm to 10 μm. A p⁻ type SOI layer 4 is provided on the BOX layer 3. An insulating film 26 is buried in a portion of the p⁻ type SOI layer 4. The insulating film 26 is, for example, a silicon oxide film and the bottom surface thereof makes contact with the BOX layer 3. The insulating film 26 is formed in a grid form, as viewed from the direction perpendicular to the surface of the semiconductor substrate 2. The insulating film 26 is formed in an inductor formation region. In addition, a CMOS 21 is formed in a portion of a region of the p⁻ type SOI layer 4 wherein the insulating film 26 is not buried. The configuration of the CMOS 21 is the same as the configuration of the CMOS 21 according to the above-described first embodiment.

An insulating film 22 is provided above the insulating film 26 and over the CMOS 21, so as to cover the CMOS 21. The bottom surface of the insulating film 22 makes contact with the top surface of the insulating film 26. In addition, an inductor 23 is formed in a region on the insulating film 22, located away from a region above the CMOS 21, that is to say, in a region corresponding to the insulating film 26. The configurations of the insulating film 22 and the inductor 23 are the same as the configurations of insulating film 22 and inductor 23 according to the above-described first embodiment.

As shown in FIG. 6, the inductor 23 is a wire having one winding in a circular loop-form, of which the inner diameter is, for example, 50 μm and the wire width is, for example, 10 μm. Terminal portions 24, making up a pair, are connected to the respective ends of the inductor 23. In addition, as shown in FIG. 6, the insulating film 22 is provided under the inductor 23 and the terminal portions 24, and the insulating film 26 is provided in a grid form in a region under the insulating film 22 located under the inductor 23. And, the outer periphery of the insulating film 26 is placed outside of the outer periphery of the inductor 23, as seen in the plan view. In addition, the CMOS 21 is formed in a portion of a region located away from a region under the insulating film 22, and located directly under the inductor 23.

Figure 7A:
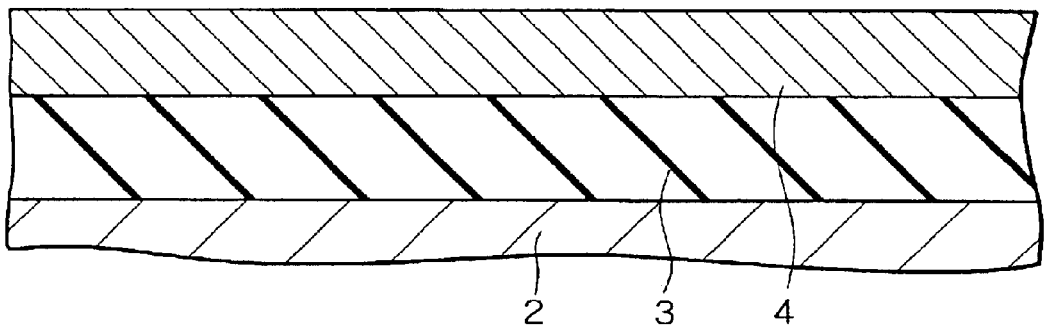
FIGS. 7A through 7C are cross sectional views showing a manufacturing method for an integrated circuit according to the present embodiment in accordance with the order of the steps thereof.
Figure 7B:
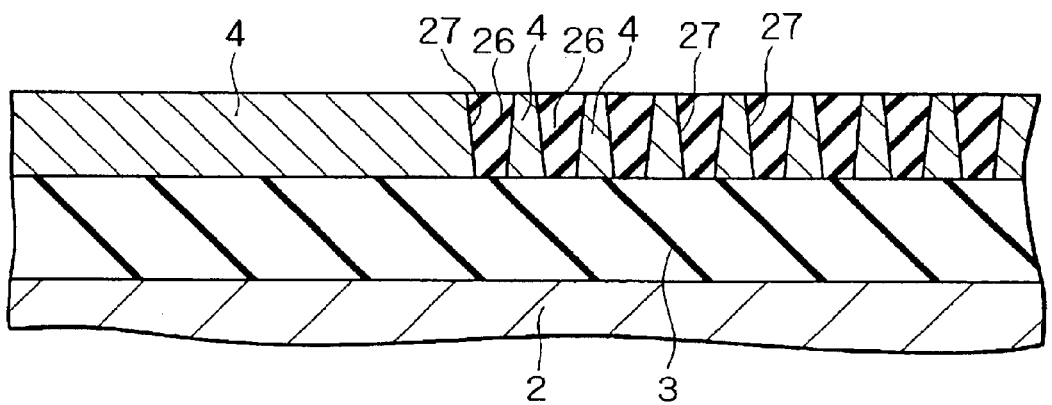
Figure 7C:
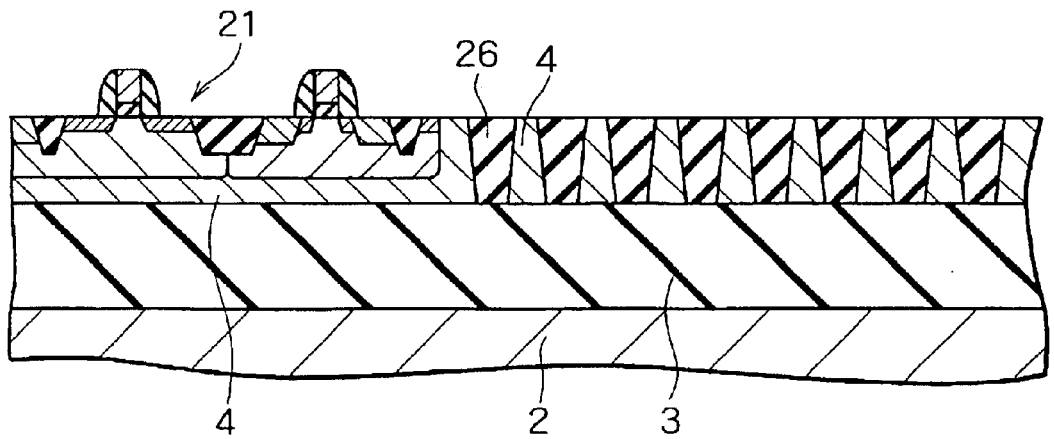

Next, a manufacturing method for the integrated circuit 31 according to the present embodiment is described. FIGS. 7A through 7C are cross sectional views showing the manufacturing method for an integrated circuit according to the present embodiment, in the order of the steps thereof. First, as shown in FIG. 7A, a semiconductor substrate 2 made of p⁻ type or p⁻⁻ type silicon having a thickness of, for example, approximately 700 μm is prepared. Next, a BOX layer 3, which is a buried insulating oxide film, is formed on the semiconductor substrate 2. The thickness of the BOX layer 3 is, for example, in the range of 0.2 μm to 10 μm. Next, a p⁻ type SOI layer 4 is formed on the BOX layer 3.

Next, as shown in FIG. 7B, a deep trench 27 reaching to the BOX layer 3 is created in a grid form, as viewed from the direction perpendicular to the surface of the semiconductor substrate 2, in a portion of the p⁻ type SOI layer 4 and an insulating material is filled into the deep trench 27 so that an insulating film 26 of a grid form is formed.

Next, as shown in FIG. 7C, a CMOS 21 is formed, according to a conventional method, in a region of a surface layer portion of the p⁻ type SOI layer 4 wherein the insulating film 26 is not formed. The configuration of the CMOS 21 is as described above.

Next, as shown in FIG. 5, an insulating film 22 is formed over the CMOS 21 and the insulating film 26 and a wire having one winding in a circular loop-form (see FIG. 6) is formed of aluminum in a region on the insulating film 22 located above the insulating film 26, so as to fabricate an inductor 23. In addition, terminal portions 24, making up a pair, are formed on the respective ends of the inductor 23 so as to make connections with the inductor 23. The terminal portions 24 are connected to wires (not shown) of the insulating film 22. Thereby, the integrated circuit 31 according to the present embodiment is fabricated.

According to the present embodiment, an effect is obtained wherein, because the insulating film 26 is formed in a grid form, it is easier to form the insulating film 26 than to form the insulating film 5 (see FIG. 2) in the integrated circuit 1, in addition to the effects according to the above-described first embodiment.

Figure 8:
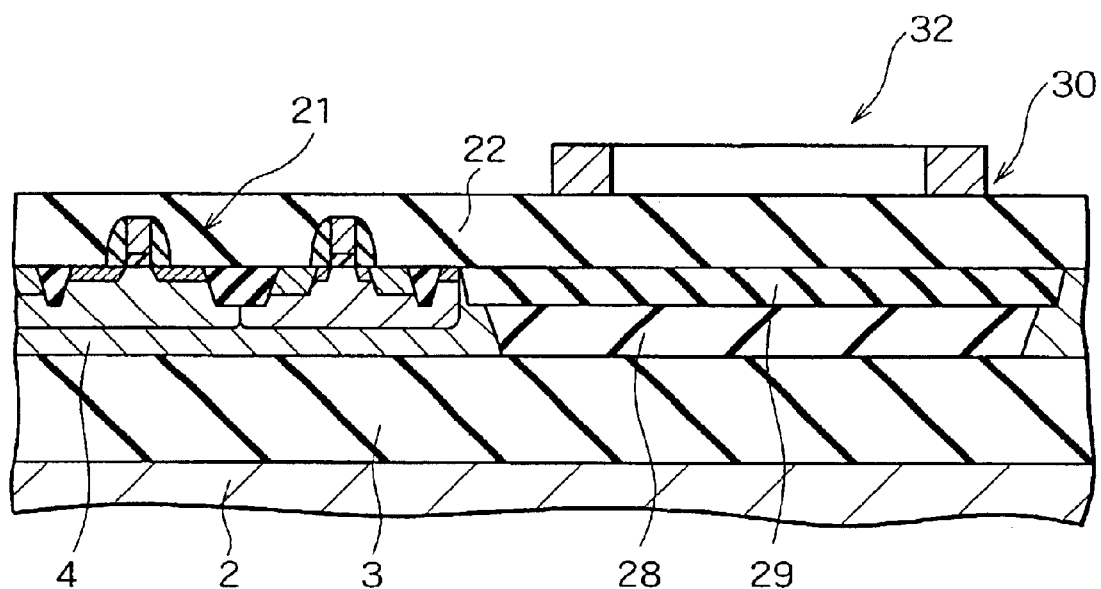
FIG. 8 is a cross sectional view showing an integrated circuit according to the third embodiment of the present invention.
Figure 9:
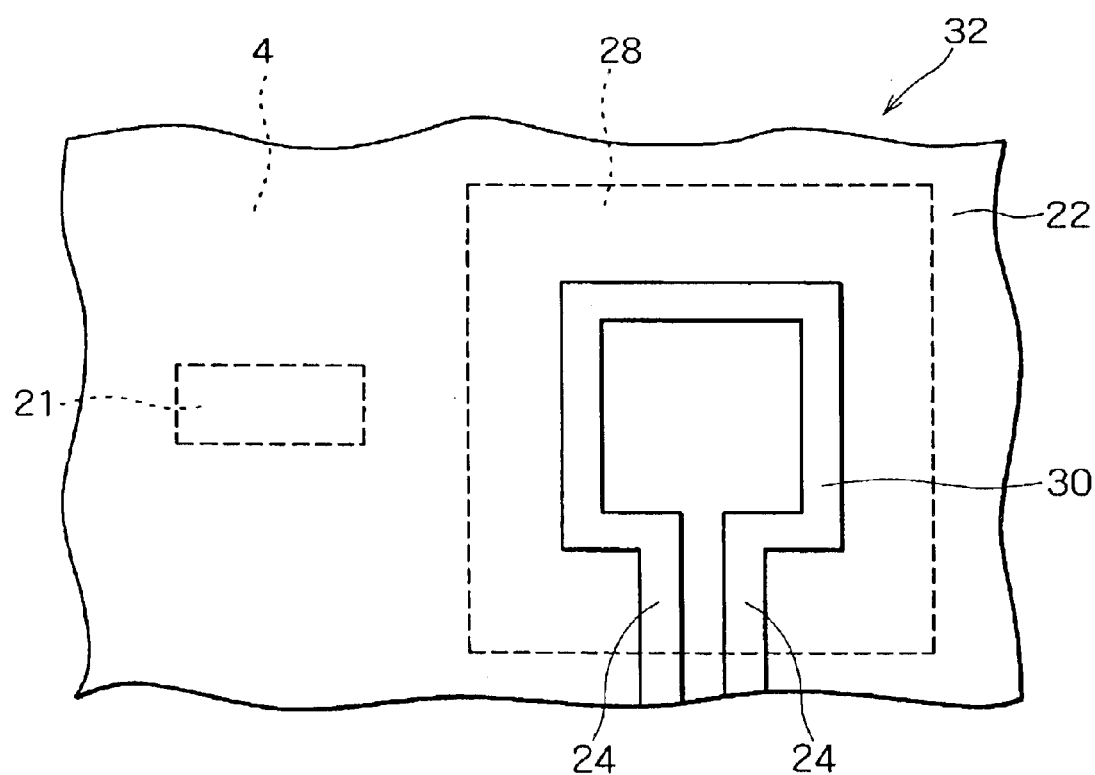
FIG. 9 is a plan view showing the integrated circuit of the present embodiment.

Next, a third embodiment of the present invention is described. FIG. 8 is a cross sectional view showing an integrated circuit according to the third embodiment of the present invention and FIG. 9 is a plan view showing this integrated circuit. The same symbols are attached to the same components, from among the components of the integrated circuit according to the present embodiment, as of integrated circuit 1 according to the above-described first embodiment and detailed descriptions thereof are omitted.

As shown in FIG. 8, an integrated circuit 32 according to the present embodiment has a configuration wherein the insulating film 5 in integrated circuit 1 (see FIG. 2) according to the first embodiment is replaced with two layers, insulating films 28 and 29. The parts of the configuration other than the above description in the integrated circuit 32 are the same as in the configuration of the integrated circuit 1 according to the first embodiment. That is to say, the integrated circuit 32 according to the present embodiment is provided with a semiconductor substrate 2 made of P⁻ type or P⁻⁻ type silicon and a BOX layer 3 is provided on the semiconductor substrate 2 and, in addition, a p⁻ type SOI layer 4 is provided on the BOX layer 3. The insulating films 28 and 29 are buried in portions of the p⁻ type SOI layer 4. The insulating films 28 and 29 are, for example, silicon oxide films wherein the bottom surface of the insulating film 28 makes contact with the top surface of the BOX layer 3 and the top surface of the insulating film 28 makes contact with the bottom surface of the insulating film 29. The insulating films 28 and 29 are formed in an inductor formation region wherein an inductor 30 is formed in a subsequent process. In addition, a CMOS 21 is formed in a portion of the region in the surface of the p⁻ type SOI layer 4 wherein neither of the insulating films 28 and 29 is buried. The configuration of the CMOS 21 is the same as the configuration of the CMOS 21 according to the above-described first embodiment.

An insulating film 22 is provided above the insulating film 29 and over the CMOS 21 so as to cover the CMOS 21. The bottom surface of the insulating film 22 makes contact with the top surface of the insulating film 29. In addition, an inductor 30 is formed on a region of the insulating film 22 located away from the CMOS 21, that is to say, in a region corresponding to the insulating film 29. The configuration of the insulating film 22 is the same as the configuration of the insulating film 22 according to the above-described first embodiment.

As shown in FIG. 9, the inductor 30 is a wire having one winding in a square loop form and is made of aluminum, wherein the longitudinal and transverse lengths of the inner dimensions of the wire loop are, for example, 50 μm, the width of the wire is, for example, 10 μm and the thickness of the wire is, for example, 2 μm. Terminal portions 24, making up a pair, are, respectively, connected to the ends of the inductor 30. In addition, as show in FIG. 9, the insulating film 22 is provided under the inductor 30 and under the terminal portions 24 and the insulating film 29 (see FIG. 8) and the insulating film 28 are formed under insulating film 22, located under inductor 30. Here, the outer periphery of insulating film 28 is placed outside of the outer periphery of the inductor 30, as seen in the plan view. In addition, the CMOS 21 is formed in a portion of the region under the insulating film 22 located away from the region directly under the inductor 30.

Figure 10A:
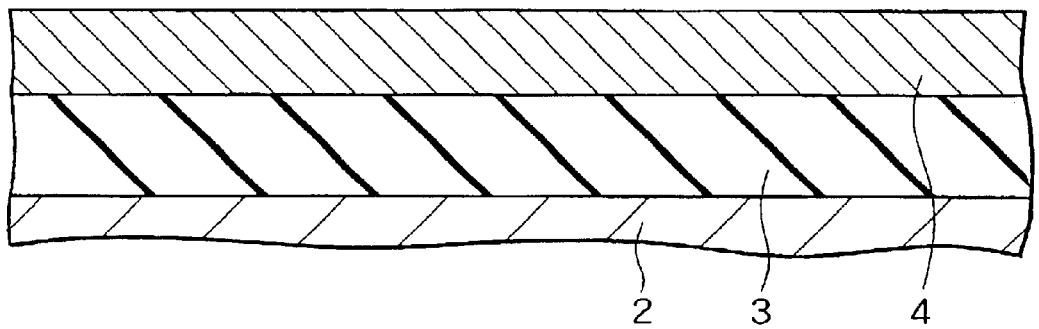
FIGS. 10A through 10C are cross sectional views showing a manufacturing method for an integrated circuit according to the present embodiment in accordance with the order of the steps thereof.
Figure 10B:
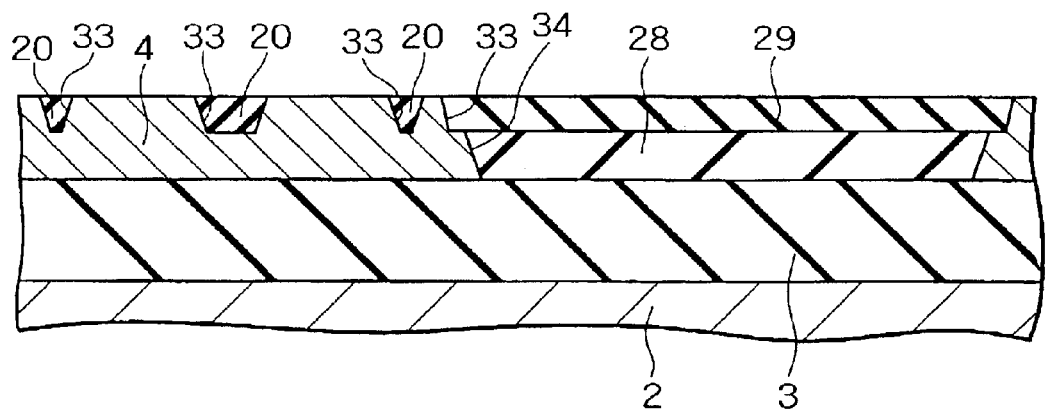
Figure 10C:
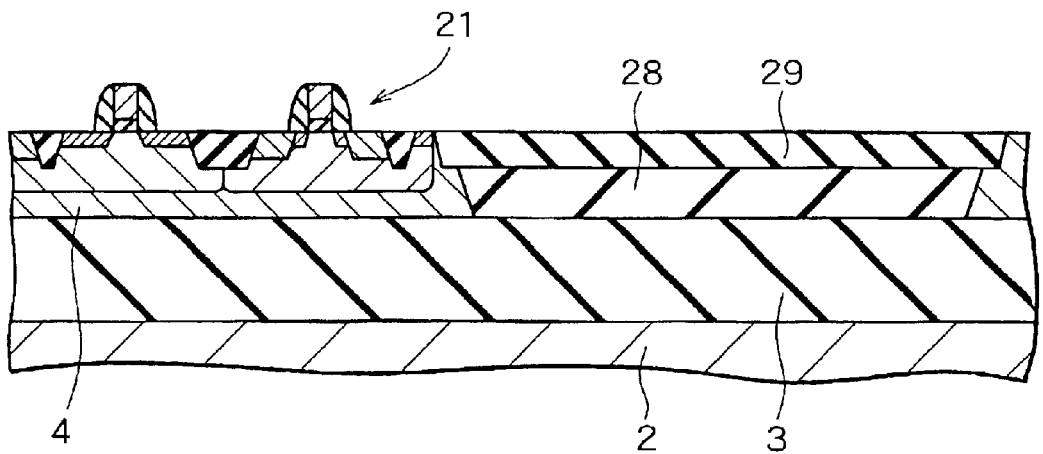

Next, a manufacturing method for the integrated circuit 32 according to the present embodiment is described. FIGS. 10A through 10C are cross sectional views showing the manufacturing method for the integrated circuit according to the present embodiment, in accordance with the order of the steps thereof. First, as shown in FIG. 10A, a BOX layer 3, which is a buried insulating oxide film, is formed on a semiconductor substrate 2, made of p⁻ type or p⁻⁻ type silicon with a thickness of, for example, approximately 700 μm. After that, a p⁻ type SOI layer 4 is formed on the BOX layer 3.

Next, as shown in FIG. 10B, shallow trenches 33 are created in the surface layer portion of the p⁻ type SOI layer 4. The shallow trenches 33 are created in both an active element formation region, wherein a CMOS 21 is formed in a subsequent process, and in an inductor formation region, wherein an inductor 30 is formed in a subsequent process. Next, a deep trench 34, which reaches to the BOX layer 3, is created at the bottom of the shallow trench 33 created in the inductor formation region. Subsequently, an insulating material is filled into the shallow trenches 33 and into the deep trench 34 so that isolation dielectrics 20 are formed within the shallow trenches 33 in the active element formation region and so that insulating films 28 and 29 are formed within the deep trench 34 and within the shallow trenches 33, respectively, in the inductor formation region.

Next, as shown in FIG. 10C, a CMOS 21 is formed according to a conventional method in a region defined by means of isolation dielectrics 20 in the surface of the p⁻ type SOI layer 4. The configuration of the CMOS 21 is as described above.

Next, as shown in FIG. 8, an insulating film 22 is formed over the CMOS 21 and above the insulating film 29 and a wire in a quadrangular loop-form (see FIG. 9) having one winding is formed of aluminum in the region of the insulating film 22 located above the insulating film 29 so as to fabricate an inductor 30. In addition, terminal portions 24, making up a pair, are formed so as to be connected to the inductor 30. The terminal portions 24 are also connected to wires (not shown) of the insulating film 22. Thereby, the integrated circuit 32 is fabricated according to the present embodiment.

Figure 11:
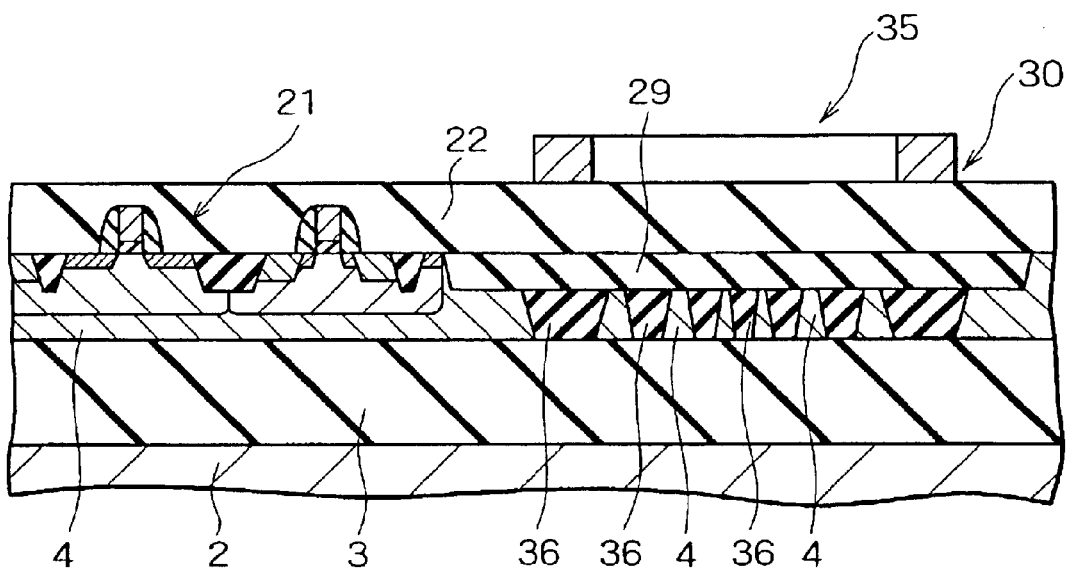
FIG. 11 is a cross sectional view showing an integrated circuit according to the fourth embodiment of the present invention.
Figure 12:
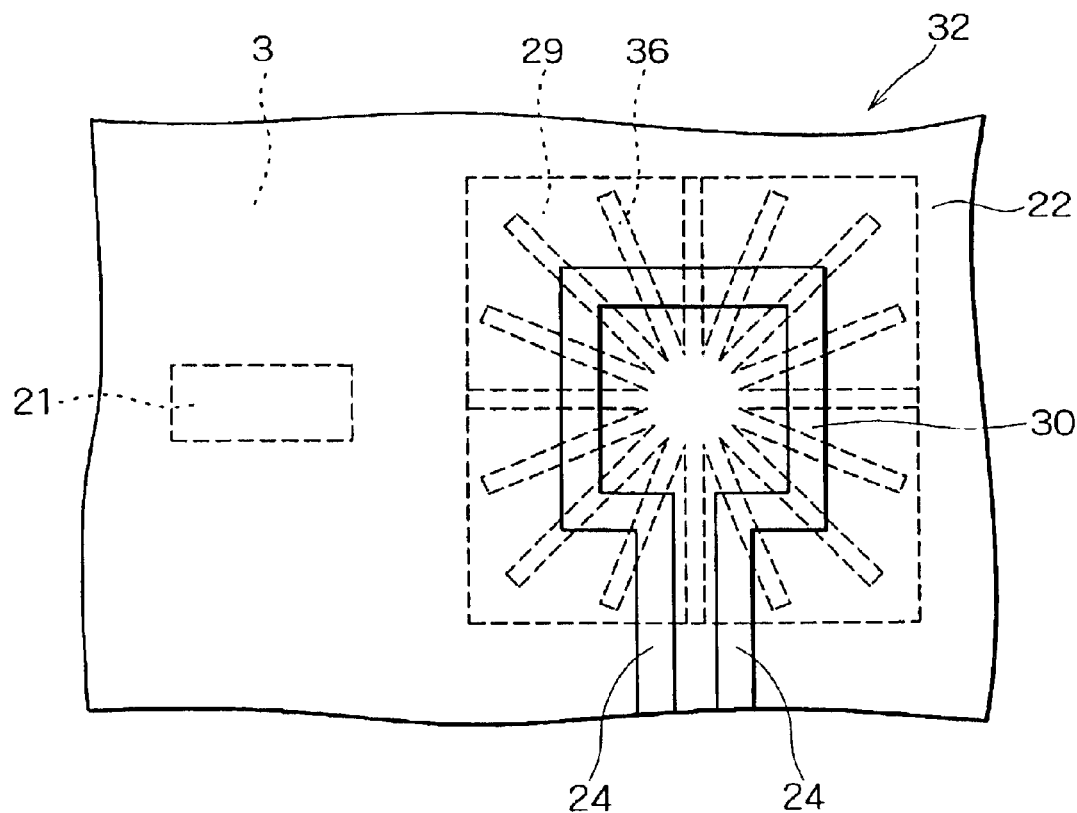
FIG. 12 is a plan view showing the integrated circuit of the present embodiment.

Next, a fourth embodiment of the present invention is described. FIG. 11 is a cross sectional view showing an integrated circuit according to the fourth embodiment of the present invention and FIG. 12 is a plan view showing this integrated circuit. The same symbols are attached to the same components, from among the components of the integrated circuit according to the present embodiment, as of the integrated circuits according to the above-described first through third embodiments and detailed descriptions thereof are omitted.

As shown in FIG. 11, an integrated circuit 35 according to the present embodiment has a configuration wherein the insulating film 28 in the integrated circuit 32 (see FIG. 8) according to the above-described third embodiment is replaced with an insulating film 36 in a radial form. The parts of the configuration other than the above in the integrated circuit 35 of the present embodiment are the same as the configuration of the integrated circuit 32 according to the above-described third embodiment. That is to say, the integrated circuit 35 according to the present embodiment is provided with a semiconductor substrate 2 made of P⁻ type or P⁻⁻ type silicon and a BOX layer 3 is provided on the semiconductor substrate 2 and, in addition, a p⁻ type SOI layer 4 is provided on the BOX layer 3. Insulating films 36 and 29 are buried in portions of the p⁻ type SOI layer 4. The insulating films 36 and 29 are, for example, silicon oxide films and the bottom surface of the insulating film 36 makes contact with the top surface of the BOX layer 3 while the top surface of the insulating film 36 makes contact with the bottom surface of the insulating film 29. The insulating film 36 is in a radial form, as viewed from the direction perpendicular to the surface of the semiconductor substrate 2. In addition, a CMOS 21 is formed in a portion of the region in the surface of p⁻ type SOI layer 4 wherein the insulating films 36 and 29 are not buried. The configuration of the CMOS 21 is the same as the configuration of the CMOS 21 according to the above-described first embodiment.

An insulating film 22 is provided above the insulating film 29 and over the CMOS 21, so as to cover the CMOS 21. The bottom surface of the insulating film 22 makes contact with the top surface of the insulating film 29. In addition, an inductor 30 is formed in a region on the insulating film 22 located away from the CMOS 21, that is to say, in a region corresponding to the insulating film 29. The configurations of the insulating films 22 and the inductor 30 are the same as the configurations of the insulating films 22 and the inductor 30 according to the above-described third embodiment.

As shown in FIG. 12, the inductor 30 is a wire in a square loop form having one winding and is made of aluminum, wherein the longitudinal and transverse lengths of the inner dimensions of the wire loop are, for example, 50 μm, the width of the wire is, for example, 10 μm and the thickness of the wire is, for example, 2 μm. Terminal portions 24, making up a pair, are, respectively, connected to the ends of the inductor 30. In addition, as shown in FIG. 12, the insulating film 22 is provided under the inductor 30 and under the terminal portions 24 and the insulating film 29 (see FIG. 11) and the insulating film 36 are formed under the insulating film 22 located under the inductor 30. The insulating film 36 is formed of a plurality of portions in thin rectangular strip-forms, wherein the portions are arranged in a radial form with the center at a position under the center portion of the inductor 30. In addition, a CMOS 21 is formed in a portion of the region under the insulating film 22 located away from the region directly under the inductor 30.

Figure 13A:
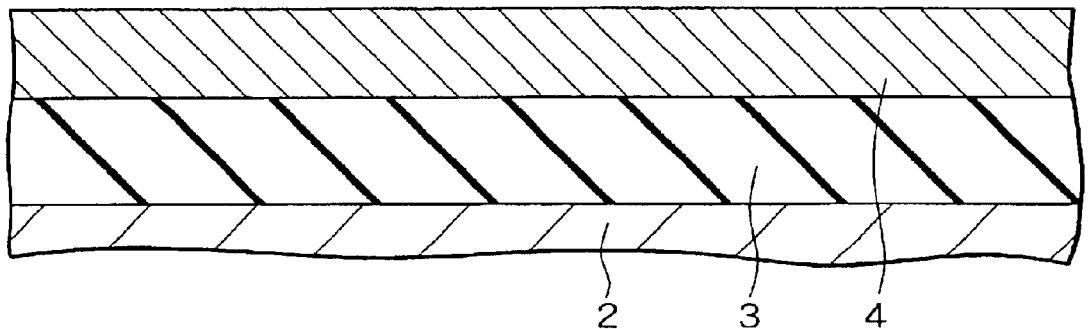
FIGS. 13A through 13C are cross sectional views showing a manufacturing method for an integrated circuit according to the present embodiment in accordance with the order of the steps thereof.
Figure 13B:
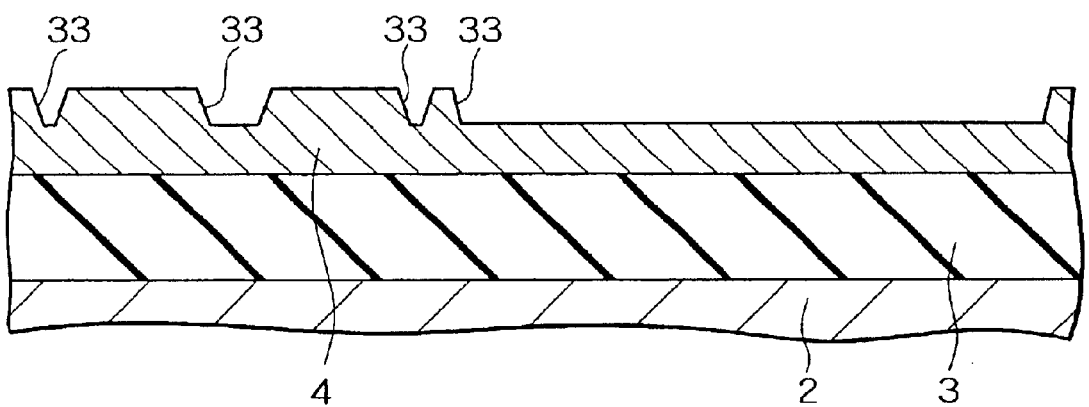
Figure 13C:
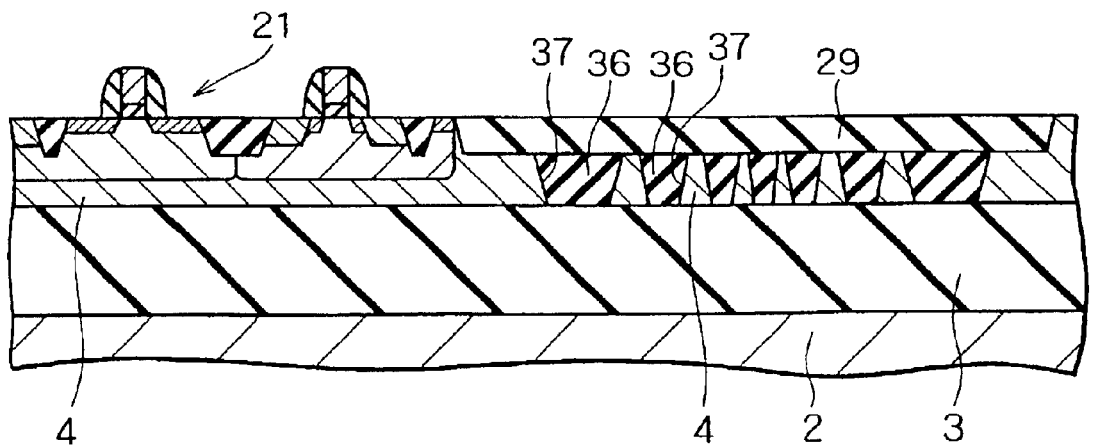

Next, a manufacturing method for the integrated circuit 35 according to the present embodiment is described. FIGS. 13A through 13C are cross sectional views showing the manufacturing method for the integrated circuit according to the present embodiment, in accordance with the order of the steps thereof. First, as shown in FIG. 13A, a BOX layer 3 is formed on a semiconductor substrate 2 made of p⁻ type or p⁻⁻ type silicon with a thickness of, for example, approximately 700 μm and a p⁻ type SOI layer 4 is formed on the BOX layer 3.

Next, as shown in FIG. 13B, shallow trenches 33 are created in the surface layer portion of the p⁻ type SOI layer 4. The shallow trenches 33 are created in both an active element formation region, wherein a CMOS 21 is formed in a subsequent process, and in an inductor formation region, wherein an inductor 30 is formed in a subsequent process. Next, a deep trench 37, which reaches to the BOX layer 3, is created in a radial form, as viewed from the direction perpendicular to the surface of the semiconductor substrate 2, at the bottom of the shallow trench 33 created in the inductor formation region. Subsequently, an insulating material is filled into the shallow trenches 33 and into the deep trench 37 so that isolation dielectrics 20 are formed within the shallow trenches 33 in the active element formation region and whereby the insulating films 36 and 29 are formed within the deep trench 37 and within the shallow trenches 33, respectively, in the inductor formation region.

Next, as shown in FIG. 13C, a CMOS 21 is formed, according to a conventional method, in a region of the surface layer portion of the p⁻ type SOI layer 4 wherein the isolation dielectrics 20 are formed, that is to say, in the active element formation region. The configuration of the CMOS 21 is as described above.

Next, as shown in FIG. 11, an insulating film 22 is formed over the CMOS 21 and above the insulating film 29 and an inductor 30 is fabricated on a region of the insulating film 22 corresponding to the insulating film 29. Next, terminal portions 24 (see FIG. 12), making up a pair, are formed at the ends of the inductor 30 so as to be connected to the inductor 30. The terminal portions 24 are also connected to wires (not shown) in the insulating film 22. Thereby, the integrated circuit 35 is fabricated according to the present embodiment.

According to the present embodiment, an effect is obtained wherein, because the insulating film 36 is formed in a radial form, it is easier to form the insulating film 36 than to form the insulating film 28 (see FIG. 8) in integrated circuit 32, in addition to the effects according to the above-described third embodiment.

What is claimed is:

1. An integrated circuit, comprising:
    a semiconductor substrate;
    a first insulating film provided on said semiconductor substrate;
    a second insulating film locally formed on said first insulating film;
    a semiconductor layer formed in a region on said first insulating film, in which said second insulating film is not formed;
    an isolation dielectrics formed on a surface of said semiconductor layer and having a thinner film thickness than said second insulating film;
    an active element formed in an active element formation region defined by said isolation dielectrics;
    a third insulating film formed on said second insulating film and said semiconductor layer; and
    an inductor formed on a portion of said third insulating film located above said second insulating film.

2. An integrated circuit, comprising:
    a semiconductor substrate;
    a first insulating film provided on said semiconductor substrate;
    a second insulating film locally formed on said first insulating film;
    a fourth insulating film formed on said second insulating film;
    a semiconductor layer formed in a region on said first insulating film, in which said second insulating film and said fourth insulating film are not formed;
    an isolation dielectrics formed on a surface of said semiconductor layer and having a film thickness thinner than the sum of the film thickness of said second insulating film and said fourth insulating film;
    an active element formed in an active element formation region defined by said isolation dielectrics;
    a third insulating film formed on said fourth insulating film and on said semiconductor layer; and
    an inductor formed on a portion of said third insulating film located above said fourth insulating film.

3. The integrated circuit according to claim 1, wherein said semiconductor substrate has a resistivity greater than that of said semiconductor layer.

4. The integrated circuit according to claim 1, wherein the resistivity of said semiconductor substrate is not less than 10·cm.

5. The integrated circuit according to claim 1, wherein the outer periphery of said second insulating film is placed outside of the outer periphery of said inductor, as viewed from the direction perpendicular to the surface of said semiconductor substrate.

6. The integrated circuit according to claim 1, wherein said second insulating film is formed in a grid form, as viewed from the direction perpendicular to the surface of said semiconductor substrate.

7. An integrated circuit, comprising:
    a semiconductor substrate;
    a first insulating film provided on said semiconductor substrate;
    a second insulating film locally formed on said first insulating film;
    a semiconductor layer formed in a region on said first insulating film, in which said second insulating film is not formed;
    an isolation dielectrics formed on a surface of said semiconductor layer;
    an active element formed in an active element formation region partitioned off by means of said isolation dielectrics;
    a third insulating film directly formed on said second insulating film and on said semiconductor layer; and
    an inductor formed on a portion of third said insulating film located above said second insulating film, wherein said second insulating film is formed of a plurality of portions in thin rectangular strip-forms so that said portions in thin rectangular strip-forms are arranged in a radial form, as viewed from the direction perpendicular to the surface of said semiconductor substrate.

8. The integrated circuit according to claim 1, wherein said second insulating film is formed of a plurality of portions in thin rectangular strip-forms so that said portions in thin rectangular strip-forms are arranged in a manner where the longitudinal directions thereof are parallel to each other, as viewed from the direction perpendicular to the surface of said semiconductor substrate.

9. An integrated circuit according to claim 1, wherein a well having a depth shallower than the film thickness of said second insulating film is formed in the surface of said semiconductor layer, while said active element is formed within said well.

10. An integrated circuit according to claim 2, wherein a well having a depth shallower than the sum of the film thickness of said second insulating film and said fourth insulating film is formed in the surface of said semiconductor layer, while said active element is formed within said well.

* * * * *